United States Patent
Ahn et al.

(10) Patent No.: US 9,525,016 B2
(45) Date of Patent: Dec. 20, 2016

(54) ORGANIC LIGHT EMITTING DISPLAY DEVICES AND METHODS OF MANUFACTURING ORGANIC LIGHT EMITTING DISPLAY DEVICES

(71) Applicant: Samsung Display Co., Ltd., Yongin (KR)

(72) Inventors: Ki-Wan Ahn, Seoul (KR); Sang-Ho Park, Suwon-si (KR); Yong-Jae Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 32 days.

(21) Appl. No.: 14/560,441

(22) Filed: Dec. 4, 2014

(65) Prior Publication Data

US 2016/0013260 A1  Jan. 14, 2016

(30) Foreign Application Priority Data

Jul. 14, 2014 (KR) .................. 10-2014-0088223

(51) Int. Cl.
*H01L 27/32* (2006.01)
(52) U.S. Cl.
CPC ......... *H01L 27/3272* (2013.01); *H01L 27/326* (2013.01); *H01L 27/3246* (2013.01)
(58) Field of Classification Search
CPC .......................... H01L 27/326; H01L 27/3246
See application file for complete search history.

(56) References Cited

U.S. PATENT DOCUMENTS

| | | | | |
|---|---|---|---|---|
| 7,215,392 B2* | 5/2007 | Nakano | ............. | G02F 1/133555 349/106 |
| 8,766,292 B2* | 7/2014 | Kim | .................... | H01L 27/3216 257/89 |
| 8,816,331 B2* | 8/2014 | Choi | ........ | H01L 27/326 257/40 |
| 9,099,681 B2* | 8/2015 | Kijima | ................ | H01L 51/5275 |
| 2005/0253507 A1* | 11/2005 | Fujimura | ............ | H01L 27/3276 313/506 |
| 2006/0087603 A1* | 4/2006 | Lee | ........................ | G02B 5/201 349/109 |

(Continued)

FOREIGN PATENT DOCUMENTS

| KR | 10-2009-0115315 | 11/2009 |
|---|---|---|
| KR | 10-2011-0080051 | 7/2011 |
| KR | 10-2013-0131693 | 12/2013 |

*Primary Examiner* — Mohammad Islam
*Assistant Examiner* — Ankush Singal
(74) *Attorney, Agent, or Firm* — H.C. Park & Associates, PLC

(57) ABSTRACT

An organic light emitting display device includes a substrate including a plurality of pixel regions and a plurality of transparent regions, thin film transistors disposed in the pixel regions, an insulation layer disposed on the thin film transistors, first electrodes electrically contacting the thin film transistors, a pixel defining layer including a black material disposed on the first electrodes, organic light emitting structures disposed on the pixel defining layer, and a second electrode disposed on the organic light emitting structures. The pixel defining layer may define an asymmetrical configuration of adjacent transparent regions disposed on opposing sides of corresponding pixel regions.

8 Claims, 13 Drawing Sheets

(56) References Cited

U.S. PATENT DOCUMENTS

| | | | |
|---|---|---|---|
| 2006/0152531 A1* | 7/2006 | Lin | G09G 3/3225 345/613 |
| 2008/0100209 A1* | 5/2008 | Ito | H01L 51/5284 313/504 |
| 2009/0236977 A1* | 9/2009 | Suh | B82Y 20/00 313/504 |
| 2010/0045575 A1* | 2/2010 | Kim | H01L 51/5284 345/76 |
| 2011/0114960 A1* | 5/2011 | Lee | H01L 27/3248 257/71 |
| 2011/0141034 A1* | 6/2011 | Lai | G06F 3/041 345/173 |
| 2011/0147770 A1* | 6/2011 | Hwang | H01L 27/326 257/89 |
| 2011/0163318 A1* | 7/2011 | Park | H01L 27/326 257/59 |
| 2011/0175097 A1* | 7/2011 | Song | H01L 27/326 257/59 |
| 2011/0204369 A1* | 8/2011 | Ha | H01L 51/5228 257/59 |
| 2011/0215712 A1* | 9/2011 | Hong | H01J 1/62 313/504 |
| 2011/0220901 A1* | 9/2011 | Ha | H01L 27/322 257/59 |
| 2011/0249211 A1* | 10/2011 | Song | G02F 1/1334 349/42 |
| 2012/0074388 A1* | 3/2012 | Park | H01L 27/3258 257/40 |
| 2012/0256186 A1* | 10/2012 | Park | H01L 27/3276 257/72 |
| 2012/0267611 A1* | 10/2012 | Chung | H01L 27/3211 257/40 |
| 2012/0268696 A1* | 10/2012 | Yim | G09G 3/32 349/104 |
| 2013/0314453 A1 | 11/2013 | Ko | |
| 2014/0183472 A1* | 7/2014 | Kim | H01L 27/3258 257/40 |
| 2015/0008400 A1* | 1/2015 | Kim | H01L 27/329 257/40 |
| 2015/0014647 A1* | 1/2015 | Cho | H01L 51/525 257/40 |
| 2015/0054719 A1* | 2/2015 | Lee | G09G 3/3208 345/76 |
| 2015/0179708 A1* | 6/2015 | Jeon | H01L 27/326 257/40 |
| 2015/0214284 A1* | 7/2015 | Kim | H01L 27/3246 257/40 |

\* cited by examiner

ORGANIC LIGHT EMITTING DISPLAY DEVICES AND METHODS OF MANUFACTURING ORGANIC LIGHT EMITTING DISPLAY DEVICES

CROSS-REFERENCE TO RELATED APPLICATION

This application claims priority from and the benefit of Korean patent Application No. 10-2014-0088223, filed on Jul. 14, 2014, which is hereby incorporated by reference for all purposes as if fully set forth herein.

BACKGROUND

1. Field

Exemplary embodiments of the present disclosure relate to organic light emitting display devices and methods of manufacturing organic light emitting display devices. More particularly, exemplary embodiments of the disclosure relate to organic light emitting display devices including a plurality of transparent regions arranged in an asymmetrical configuration and methods of manufacturing the organic light emitting display devices.

2. Discussion of the Background

Recently, a transparent organic light emitting display device has been developed as a next-generation display devices. The transparent organic light emitting display device may include a transparent region and a pixel region. In the transparent organic light emitting display device, an image of an object before and/or after a transparent region of the organic light emitting display device may be recognized by a user, while the organic light emitting display device is in an OFF state. In an ON state of the organic light emitting display device, an image may be displayed in a pixel region of the organic light emitting display device using a light generated from an organic light emitting layer of the pixel.

However, since the transparent regions may be repeatedly arranged with a constant gap in the conventional transparent organic light emitting display device, each of the transparent regions may operate as optically multiple slits. The multiple slits may cause diffraction interference of a light passing therethrough, so that the image of the object viewed through the conventional transparent organic light emitting display device may be distorted, while the conventional transparent organic light emitting display device is in the OFF state. Such image distortion may reduce the quality of images displayed in the pixel region, while the conventional transparent organic light emitting display device is in the ON state.

The above information disclosed in this Background section is only for enhancement of understanding of the background of the invention and, therefore, it may contain information that does not constitute prior art.

SUMMARY

Exemplary embodiments provide an organic light emitting display device including a plurality of transparent regions arranged in an asymmetrical configuration to prevent image distortion by suppressing a diffraction interference of light, while the organic light emitting display device is in an OFF state, and also to improve the quality of images displayed in pixel regions, while the organic light emitting display device is in an ON state.

According to one aspect of the invention, there is provided an organic light emitting display device in accordance with exemplary embodiments of the present disclosure may include a substrate including a plurality of pixel regions and a plurality of transparent regions, thin film transistors disposed in the pixel regions, an insulation layer disposed on the thin film transistors, first electrodes electrically contacting the thin film transistors, a pixel defining layer including a black material disposed on the first electrodes, the pixel defining layer at least partially defining the transparent regions, such that adjacent transparent regions disposed on opposing sides of corresponding pixel regions have an asymmetrical configuration, organic light emitting structures disposed on the pixel defining layer, and a second electrode disposed on the organic light emitting structures.

According to one aspect of the invention, there is provided an organic light emitting display device in accordance with some exemplary embodiments of the present disclosure may include a substrate including a plurality of pixel regions and a plurality of transparent regions, a black matrix including a black material disposed in the pixel region, the black matrix at least partially defining the transparent regions, such that adjacent transparent regions disposed on opposing sides of corresponding pixel regions have an asymmetrical configuration, thin film transistors disposed on the black matrix, an insulation layer disposed on the thin film transistors, first electrodes electrically contacting the thin film transistors, a pixel defining layer disposed on the first electrodes, organic light emitting structures disposed on the pixel defining layer, and a second electrode disposed on the organic light emitting structures.

According to another aspect of the invention, there is provided a method of manufacturing an organic light emitting display device in accordance with exemplary embodiments. In the method, a substrate including a plurality of pixel regions and a plurality of transparent regions may be provided. Thin film transistors may be formed in the pixel regions. An insulation layer may be formed on the thin film transistors. First electrodes electrically connected to the thin film transistors may be formed. A pixel defining layer may be formed on the first electrodes using a black material. Here, the pixel defining layer at least partially defines the transparent regions, such that adjacent transparent regions on opposing sides of corresponding pixel regions have an asymmetrical configuration. Organic light emitting structures may be formed on the pixel defining layer. A second electrode may be formed on the organic light emitting structures.

According to another aspect of the invention, there is provided a method of manufacturing an organic light emitting display device in accordance with some exemplary embodiments. In the method, a substrate including a plurality of pixel regions and a plurality of transparent regions may be formed. A black matrix in the pixel regions may be formed using a black material. In this case, the black matrix may at least partially define the transparent regions, such that an asymmetrical configuration of adjacent transparent regions disposed on opposing sides of corresponding pixel regions have an asymmetrical configuration. Thin film transistors may be formed on the black matrix. An insulation layer may be formed on the thin film transistors. First electrodes electrically contacting the thin film transistors may be formed. A pixel defining layer may be formed on the first electrodes. Organic light emitting structures may be formed on the pixel defining layer. A second electrode disposed may be formed on the organic light emitting structures.

According to exemplary embodiments, an organic light emitting display device in accordance with exemplary embodiments may include a pixel defining layer that at least partially defines shapes of adjacent transparent regions. The pixel defining layer may have openings partially exposing the transparent regions of a substrate. In this case, the adjacent transparent regions separated from each other by a predetermined distance on opposing sides of the pixel regions, and may be arranged in an asymmetrical configuration. For example, portions of the black matrix may be disposed on side walls of the openings, to at least partially define the transparent regions, such that the adjacent transparent regions have different surface areas. Thus, diffraction interference of a light passing through the organic light emitting display device may be suppressed by substantially reducing or substantially eliminating a periodicity of the shapes of the transparent regions. Therefore, as compared with a conventional organic light emitting display device having a plurality of transparent regions repeatedly arranged with a constant gap, the image distortion due to multiple images may be prevented, while the organic light emitting display device is in the OFF state. Thus, the quality of the images displayed in the pixel regions I of the organic light emitting display device may be improved, while the organic light emitting display device is in the ON state. An organic light emitting display device according to various embodiments may include a black matrix that at least partially defines the shapes of adjacent transparent regions. The black matrix may have openings partially exposing the transparent regions of a substrate and may not be disposed in the opening. Here, the adjacent transparent regions may be arranged in an asymmetrical configuration.

For example, the adjacent transparent regions by interposing a pixel region may be determined by the black matrix and may have different surface areas. Thus, diffraction interference of light passing through the organic light emitting display device in accordance with exemplary embodiments may be suppressed by substantially weakening or substantially eliminating a periodicity of the shapes of the transparent regions. A method of manufacturing an organic light emitting display device in accordance with exemplary embodiments, process for manufacturing an opening that defines an asymmetrical configuration of adjacent transparent regions may be additionally performed. Thus, the image distortion due to multiple images may be prevented, while the organic light emitting display device is in the OFF state. Thus, the quality of the images displayed in the pixel regions I of the organic light emitting display device may be improved, while the organic light emitting display device is in the ON state.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE EXEMPLARY EMBODIMENTS

Hereinafter, organic light emitting display devices and methods of manufacturing the organic light emitting display devices in accordance with exemplary embodiments will be explained in detail with reference to the accompanying drawings.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 1:
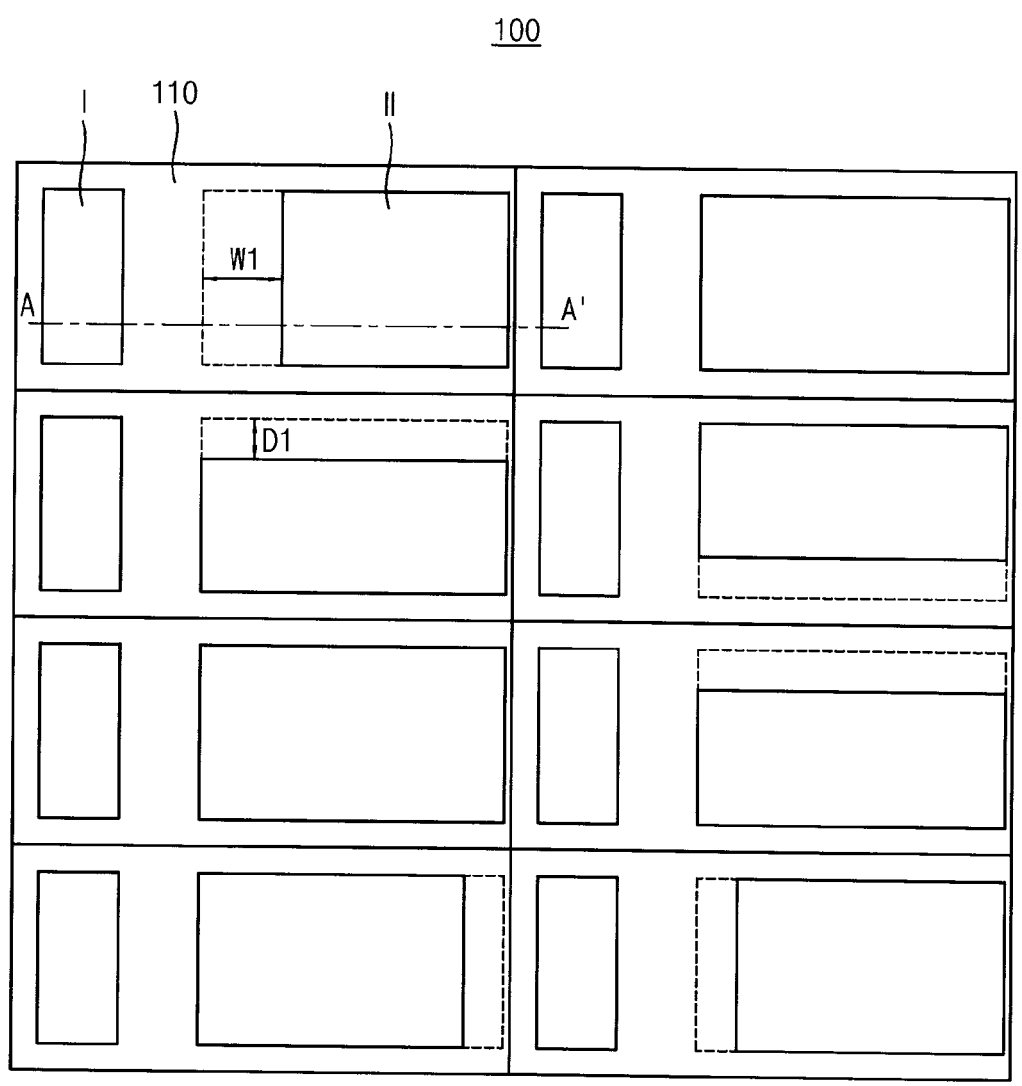
FIG. 1 is a plan view illustrating an organic light emitting display device in accordance with exemplary embodiments.
Figure 2:
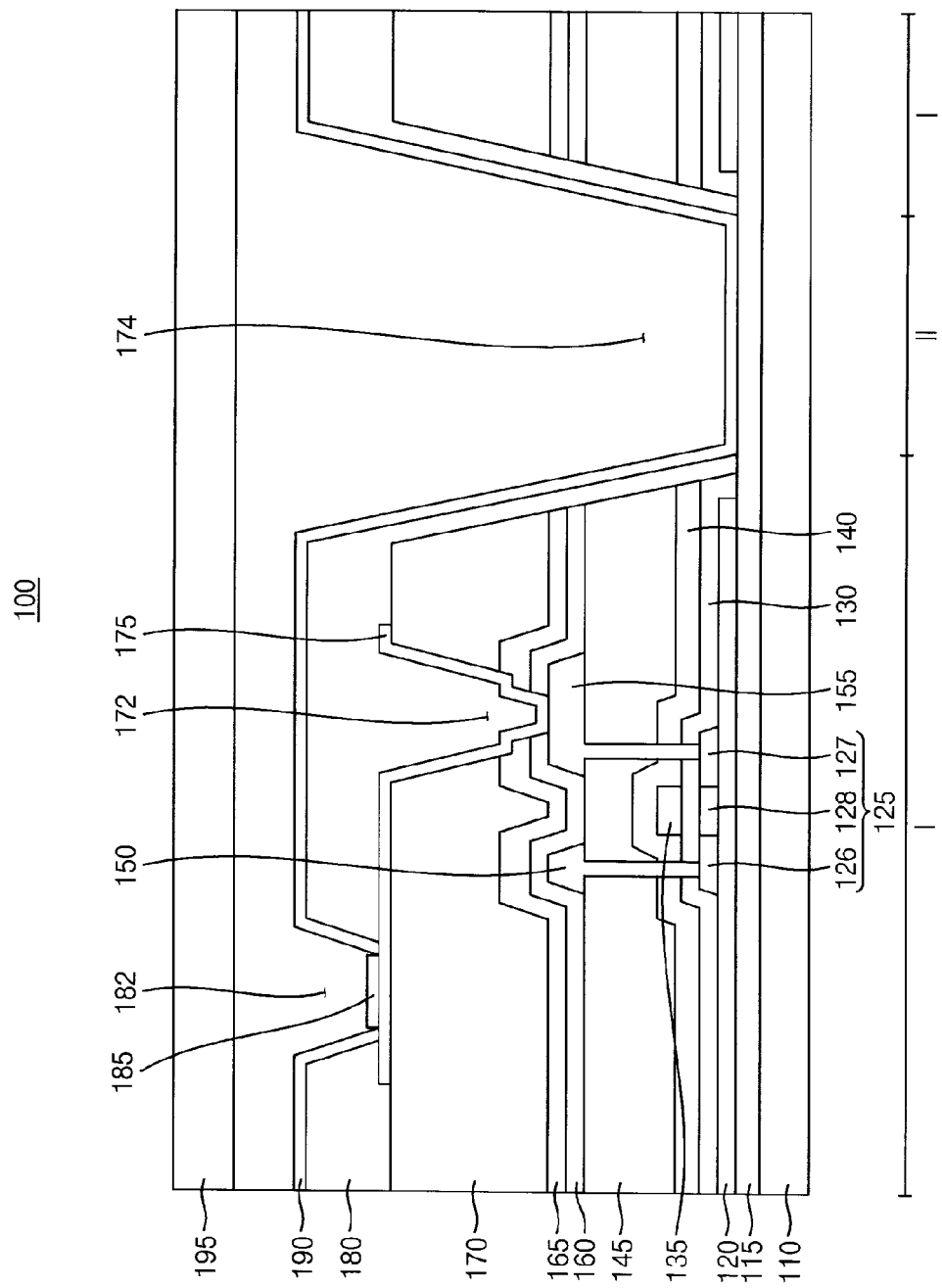
FIG. 2 is a cross sectional view taken along a line A-A' of FIG. 1.

FIG. 1 is a plan view illustrating an organic light emitting display device in accordance with exemplary embodiments. FIG. 2 is a cross sectional view taken along a line A-A' of FIG. 1.

Referring to FIGS. 1 and 2, an organic light emitting display device 100 may include a substrate 110, thin film transistors, an insulation layer 170, first electrodes 175, a pixel defining layer 180, organic light emitting structures 185, a second electrode 190, etc.

The substrate 110 may include a transparent insulation substrate. The substrate 110 may include a plurality of pixel regions I and a plurality of transparent regions II adjacent to the pixel regions I.

A buffer layer 115 may be disposed on the substrate 110. The buffer layer 115 may have a substantially flat upper surface. When the substrate 110 has a relatively irregular surface, the buffer layer 115 may be configured to planarize the surface of the substrate 110.

Referring to FIG. 2, a light blocking member 120 may be disposed on the buffer layer 115 in the pixel region I. Incident light may be substantially blocked by the light blocking member 120. For example, the light blocking member 120 may be disposed on a portion of the pixel region I of the substrate 110. Thus, when the organic light emitting display device 100 is in an ON state, images may be uniformly displayed in the pixel region I of the organic light emitting display device 100, because the light blocking member 120 may substantially block external incident light. For example, the light blocking member 120 may include a metal compound, a black material, a metal having a relatively low reflectivity, an insulation resin, a light blocking paint, etc. Although the light blocking member 120 is disposed on the buffer layer 115 in FIG. 2, the invention is not limited thereto. For example, no light blocking member may be provided on the buffer layer 115.

Each of the thin film transistors may be disposed on the light blocking member 120. Each thin film transistor may include an active pattern 125 containing silicon or an oxide semiconductor. For example, each thin film transistor may include the active pattern 125, a first gate insulation layer 130, a gate electrode 135, a second gate insulation layer 140, a first insulating interlayer 145, a source electrode 150, a drain electrode 155, etc.

The active pattern 125 may be disposed on the light blocking member 120. For example, the active pattern 125 may include a source region 126 and a drain region 127, which may be doped with impurities. The active pattern 125 may additionally include a channel region 128 provided between the source region 126 and the drain region 127.

The first gate insulation layer 130 may be disposed on the buffer layer 115 to substantially cover the active pattern 125. For example, the first gate insulation layer 130 may include a silicon oxide, a metal oxide, etc.

The gate electrode 135 may be located on the first gate insulation layer 130. The gate electrode 135 may be positioned on a portion of the first gate insulation layer 130 under which the active pattern 125 is located.

The second gate insulation layer 140 may be disposed on the first gate insulation layer 130 to cover the gate electrode 135. The second gate insulation layer 140 may include a material substantially the same as that of the first gate insulation layer 130. Alternatively, the second gate insulation layer 140 may include a material different from that of the first gate insulation layer 130.

The first insulating interlayer 145 may be positioned on the second gate insulation layer 140. The first insulating interlayer 145 may electrically insulate the source and the drain electrodes 150 and 155 from the gate electrode 135. The insulating interlayer 145 having a substantially uniform thickness may be provided on the second gate insulation layer 140 along a profile of the gate electrode 135. The insulating interlayer 145 may include a silicon compound.

As illustrated in FIG. 2, the source electrode 150 and the drain electrode 155 may be disposed on the first insulating interlayer 145. The source and the drain electrodes 150 and 155 may pass through the first insulating interlayer 145, the second gate insulation layer 140 and the first gate insulation layer 130 to thereby contact the source and the drain regions 126 and 127, respectively. Each of the source and the drain electrodes 150 and 155 may include metal, alloy, metal nitride, conductive metal oxide, a transparent conductive material, etc.

The second insulating interlayer 160 may be disposed on the first insulating interlayer 145 to cover the source and the drain electrodes 150 and 155. For example, the second insulating interlayer 160 may include a material substantially the same as that of the first insulating interlayer 145.

The third insulating interlayer 165 may be located on the second insulating interlayer 160. For example, the third insulating interlayer 165 may include a material substantially the same as those of the first and the second insulating interlayers 145 and 160.

The insulation layer 170 may be disposed on the third insulating interlayer 165. The insulation layer 170 may include a black material. Examples of the black material for the insulation layer 170 may include carbon black, phenylene black, aniline black, cyanine black, nigrosine acid black and/or a black resin. Thus, as illustrated in FIG. 1, the transparent regions II may be at least partially defined by the insulation layer 170. Adjacent transparent regions II may be separated from each other by a predetermined distance with at least one pixel region I interposed between the adjacent transparent regions II. In this case, the adjacent transparent regions II may be arranged in an asymmetrical configuration. Further, the adjacent transparent regions II may have different surface areas, respectively. In other words, the adjacent transparent regions II separated by the pixel region I may have different widths W1 or different lengths D1, respectively. Accordingly, a diffraction interference of a light passing through the organic light emitting display device 100 may be suppressed by substantially weakening or substantially eliminating a periodicity of the shapes of the transparent regions II. Therefore, an image distortion may be efficiently prevented while the organic light emitting display device 100 is in the OFF state. Thus, the quality of images displayed in the pixel region I of the organic light emitting display device 100 may be improved, while the organic light emitting display device 100 is in the ON state.

As illustrated in FIG. 2, an opening 174 may be provided through the first and the second gate insulation layers 130 and 140, the first to the third insulating interlayer 145, 160 and 165, and the insulation layer 170. The opening 174 may partially expose the transparent region II of the substrate 110. In exemplary embodiments, the shape of the transparent region II may be at least partially defined by the insulation layer 170. In some exemplary embodiments, the shape of the transparent region II may be at least partially defined by the pixel defining layer 180. The pixel defining layer 180 will be described below.

Referring now to FIG. 2, the first electrode 175 may be disposed in the insulation layer 170. The first electrode 175 may contact the drain electrode 155 through the second insulating interlayer 160, the third insulating interlayer 165, and the insulation layer 170. For example, the first electrode 175 may include a reflective material or a transmittance material.

The pixel defining layer 180 may be positioned on the first electrode 175. The pixel defining layer 180 may have a pixel opening 182 partially exposing the first electrode 170. The pixel defining layer 180 may extend on a sidewall of the opening 174. The pixel defining layer 180 may include a black material. Examples of the black material for the pixel defining layer 180 may include carbon black, phenylene black, aniline black, cyanine black, nigrosine acid black, and/or a black resin. In this case, the adjacent transparent regions II exposed by the pixel defining layer 180 disposed on the sidewall of the opening 174 may be arranged in an asymmetrical configuration. Further, areas of the adjacent transparent regions II may be different from each other. In other words, the asymmetrical configuration of the adjacent transparent regions II disposed on opposing sides of a corresponding pixel region I may have different widths and/or different lengths, respectively. As illustrated in FIG. 1, the adjacent transparent regions II may have different widths W1 and/or different lengths D1, so that the periodicity of the shapes of the transparent regions II may be substantially reduced or eliminated. Therefore, as compared with a conventional organic light emitting display device having the plurality of transparent regions repeatedly arranged with the constant gap, the image distortion due to multiple images may be prevented, while the organic light emitting display device is in the OFF state. Thus, the quality of the images displayed in the pixel region I of the organic light emitting display device 100 may be improved while the organic light emitting display device 100 is in the ON state.

The organic light emitting display device 100 may include the transparent regions II arranged in the asymmetrical configuration centering the at least one pixel region I. Thus, the diffraction interference of the light passing through the organic light emitting display device 100 may be reduced by substantially reducing or eliminating the periodicity of the shapes of the transparent regions II. Therefore, the image distortion may be prevented while the organic light emitting display device 100 is in the OFF state. Thus, the quality of the images displayed in the pixel region I may be improved while the organic light emitting display device 100 is in the ON state.

The organic light emitting structure 185 may be disposed on the first electrode 175 exposed by the pixel opening 182 of the pixel defining layer 180. The organic light emitting structure 185 may extend onto the sidewall of the pixel opening 182 of the pixel defining layer 180. For example, a plurality of organic light emitting layers may be stacked on the first electrode 170 using light emitting materials for generating different colors of light, such as a red light (R), green light (G), and blue light (B), in accordance with the colors pixels of the organic light emitting display device 100. In some exemplary embodiments, the organic light emitting layer of the of the organic light emitting structure 185 may include a plurality of stacked light emitting materials for generating red, green, and blue light, to thereby emit white light.

The second electrode 190 may be positioned on the pixel defining layer 180 and the organic light emitting structure 185. The second electrode 190 may include a material substantially the same as that of the first electrode 170.

FIGS. 3 to 7 are cross sectional views illustrating a method of manufacturing an organic light emitting display device in accordance with exemplary embodiments of the present disclosure.

Figure 3:
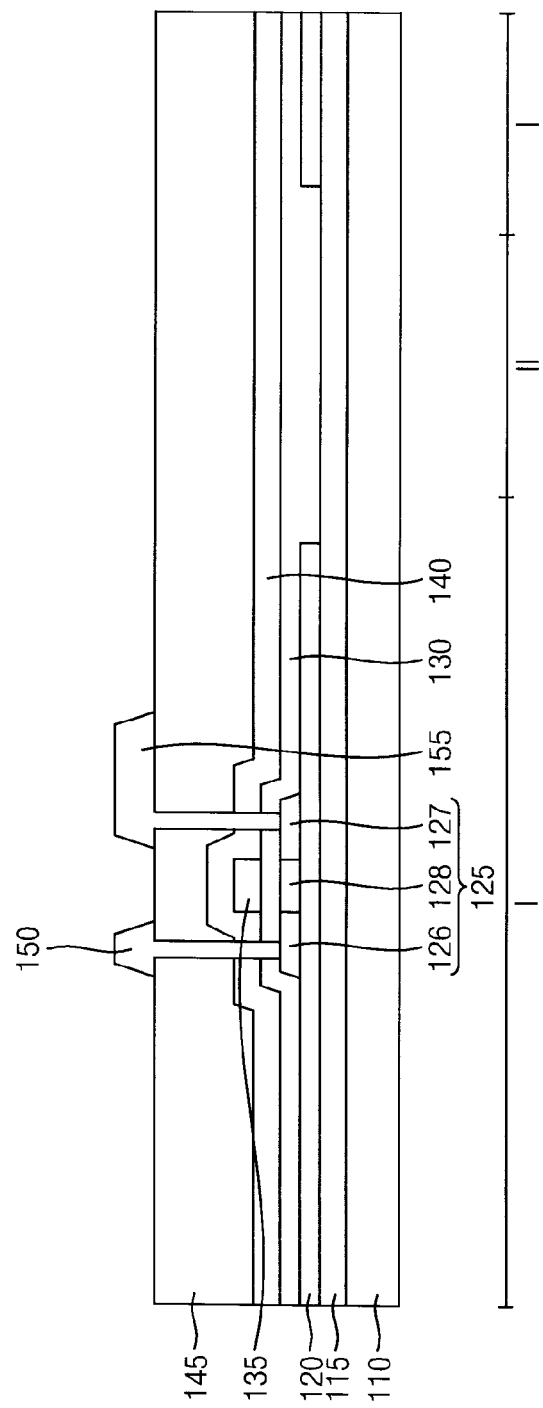
FIGS. 3 to 7 are cross sectional views illustrating a method of manufacturing an organic light emitting display device in accordance with exemplary embodiments.

Referring to FIG. 3, a buffer layer 115 may be formed on a substrate 110. The substrate 110 may include a plurality of pixel regions I and a plurality of transparent region II adjacent to the pixel regions I. For example, the buffer layer 115 may be formed using silicon nitride or silicon oxide.

An active pattern 125 may be formed on the buffer layer 115. The active pattern 125 may be formed using silicon or an oxide semiconductor.

Referring now to FIG. 3, a first gate insulation layer 130 may be formed on the buffer layer 115. The first gate insulation layer 130 may cover the active pattern 125. For example, the first gate insulation layer 130 may be formed using a silicon compound such as silicon oxide, silicon carbon oxide, etc.

A gate electrode 135 may be formed on the first gate insulation layer 130. The gate electrode 135 may be formed using a metal, an alloy, a conductive metal oxide, a transparent conductive material, etc. The gate electrode 135 may be formed on a portion of the first gate insulation layer 130 under which the active pattern 125 is located. Additionally, a source region 126 and a drain region 127 may be formed in the active pattern 125 by doping the impurities into the active pattern 125 using the gate electrode 135 as masks.

A second gate insulation layer 140 may be formed on the first gate insulation layer 130. The second gate insulation layer 140 may cover the gate electrode 135. The second gate insulation layer 140 may be formed using a material substantially the same as a material of the first gate insulation layer 130. Alternatively, the second gate insulation layer 140 may be formed using a material different from that of the first gate insulation layer 130.

A first insulating interlayer 145 may be formed on the second gate insulation layer 140. The first insulating interlayer 145 may be formed using silicon compound, transparent resin, etc.

A source electrode 150 and a drain electrode 155 may be formed on the first insulating interlayer 145. For example, the source electrode 150 and the drain electrode 155 may be formed using a metal, an alloy, a conductive metal oxide, a transparent conductive material, etc. The drain electrode 155 may contact the drain region 127 of the active pattern 125, and the source electrode 150 may contact the source region 126 of the active pattern 125.

Figure 4:
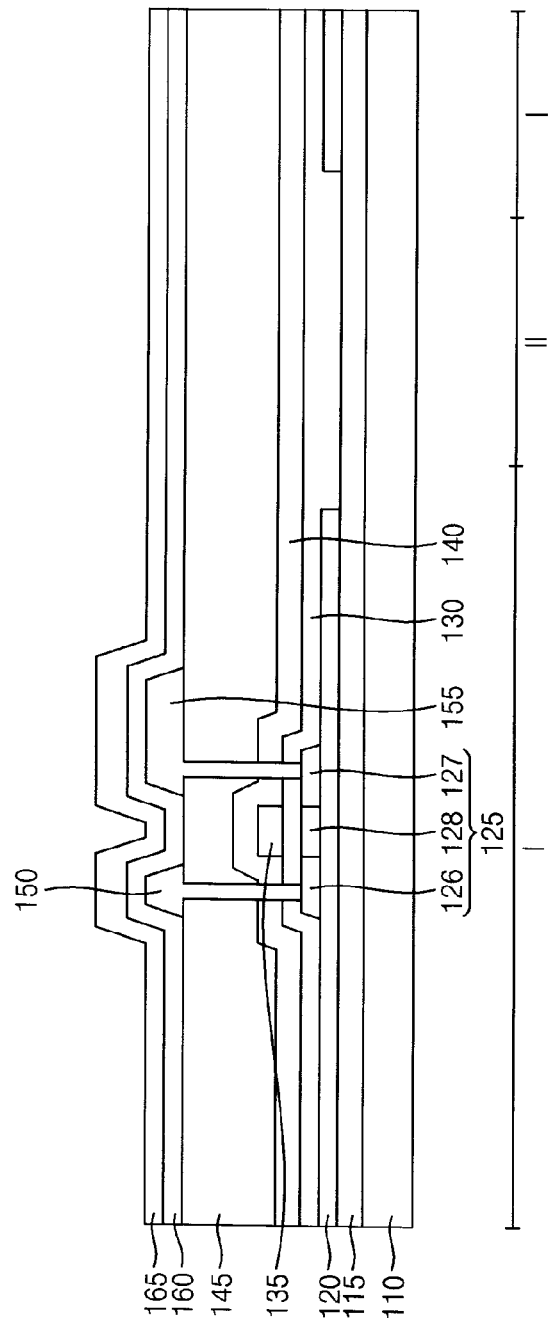

Referring to FIG. 4, a second insulating interlayer 160 may be formed on the first insulating interlayer 145 to cover the source electrode 150 and the drain electrode 155. A third insulating interlayer 165 may be formed on the second insulating interlayer 160. The second and the third insulating interlayer 160 and 165 may be formed using a material substantially the same as that of the first insulating interlayer 145.

Figure 5:
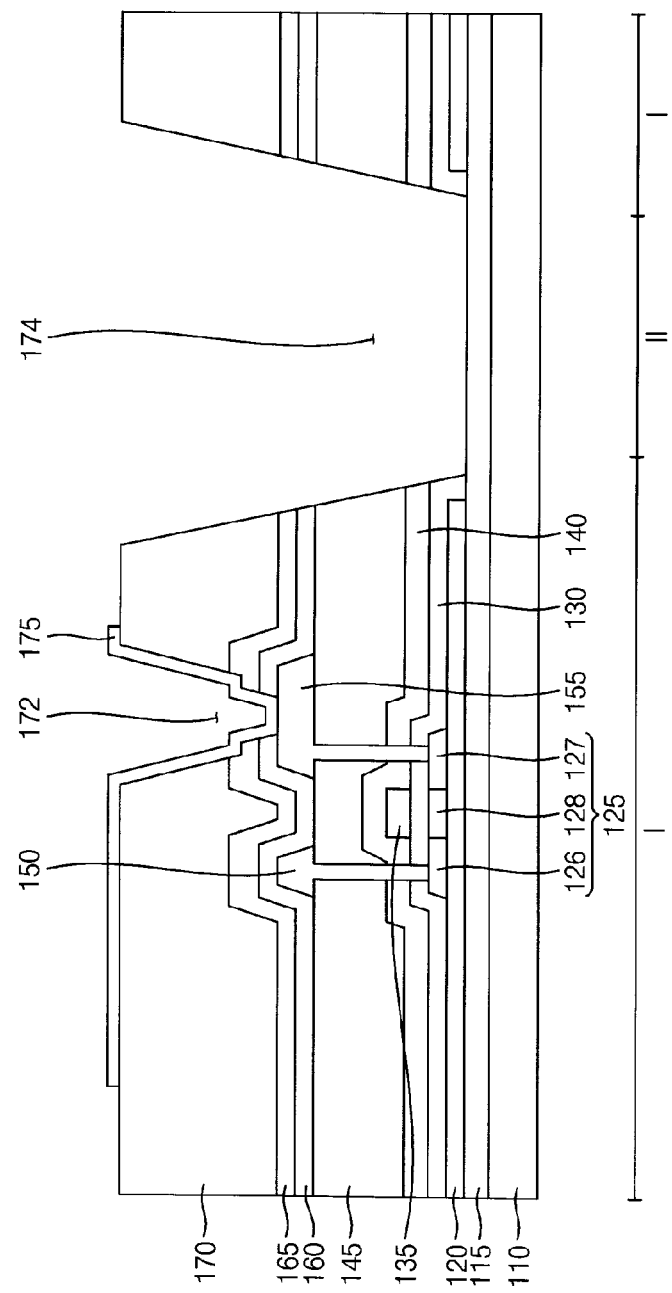

Referring to FIG. 5, an insulation layer 170 may be formed on the third insulating interlayer 165 to cover the thin film transistor. The second insulating interlayer 160, the third insulating interlayer 165, and the insulation layer 170 may be partially etched to form a contact hole 172 partially exposing the drain electrode 155. Simultaneously, the first gate insulation layer 130, the second gate insulation layer 140, the first insulating interlayer 145, the second insulating interlayer 160, the third insulating interlayer 165, and the insulation layer 170 may be partially etched to form an opening 174 partially exposing the transparent region II of the substrate 110. The contact hole 172 and the opening 174 may be formed using the same dry etching process or wet etching process, using one mask. For example, the contact hole 172 and the opening 174 may be simultaneously formed using a same etching gas or etching solution. For example, the insulation layer 170 may be formed using an organic material, an inorganic material, etc. The insulation layer 170 may include a black material. Examples of the black material for the insulation layer 170 may include carbon black, phenylene black, aniline black, cyanine black, nigrosine acid black and/or a black resin. The insulation layer 170 may be formed by a spin coating process, a printing process, a sputtering process, a chemical vapor deposition process, an atomic layer deposition process, a plasma enhanced chemical vapor deposition process, a high density plasma-chemical vapor deposition (HDP-CVD) process, a vapor deposition process, etc.

In this case, the insulation layer 170 may define the asymmetrical configuration of the adjacent transparent regions II. For example, the adjacent transparent regions II bordering one pixel region I may have different widths and/or different lengths, so that surface areas of the adjacent transparent regions II may be different from each other. That is, the transparent regions II separated from each other by a predetermined distance and may have different widths W1 and/or lengths D1, so that periodicity of shapes of the transparent regions II may be substantially reduced or eliminated. Therefore, a diffraction interference of light may be suppressed in the transparent region II, so that the image of the object before and/or after the transparent region II of the organic light emitting display device 100 may not be distorted.

Referring now to FIG. 5, a first electrode 175 may be formed on the insulation layer 170 by filling the contact hole 172. The first electrode 175 may include a reflective material. Alternatively, the first electrode 175 may include a transparent material.

Figure 6:
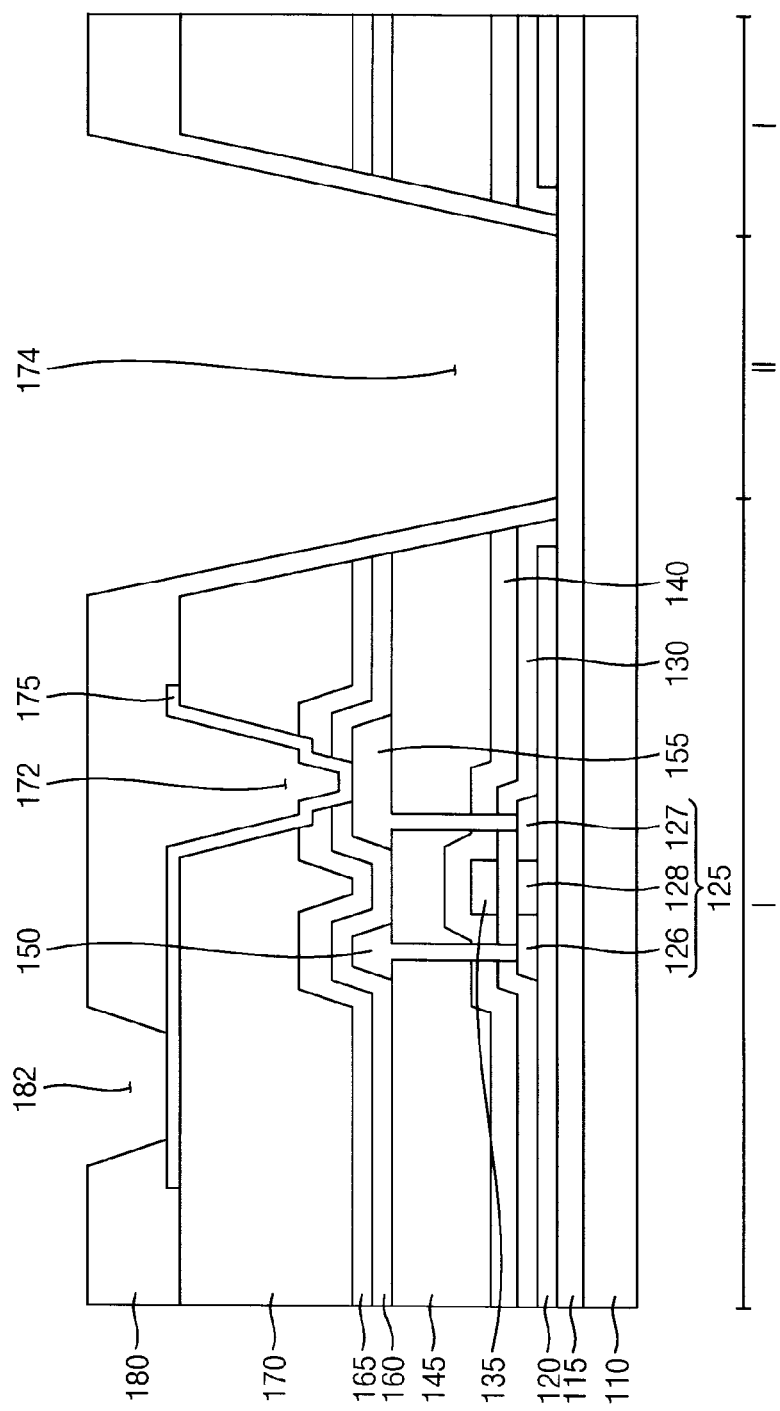

Referring to FIG. 6, a pixel defining layer 180 having a pixel opening 182 partially exposing the first electrode 155 may be formed on the first electrode 175 and the insulation layer 170. The pixel defining layer 180 may extend onto the sidewalls of the opening 174 of the pixel defining layer 180. For example, the pixel defining layer 180 may include a black material. The black material may include carbon black, phenylene black, aniline black, cyanine black, nigrosine acid black and/or a black resin. The pixel defining layer 180 may be formed by a printing process, a spray process, a spin coating process, a chemical vapor deposition process, etc.

Accordingly, the surface areas of portions of the pixel defining layer 180 disposed on the sidewall of the opening 174 may be different from each other. As a result, the portions of the pixel defining layer 180 disposed on the sidewalls of the openings 174 may define the asymmetrical configuration of the adjacent transparent regions II. For example, since the adjacent transparent regions II bordering one pixel region I may have different widths W1 or different lengths D1, the surface areas of the adjacent transparent regions II may be different from each other. Thus, the periodicity of the shapes of the transparent regions II may be substantially reduced or eliminated by suppressing a diffraction interference of light. As a result, the image of the object before and/or after the transparent region II of the organic light emitting display device 100 may not be distorted.

Figure 7:
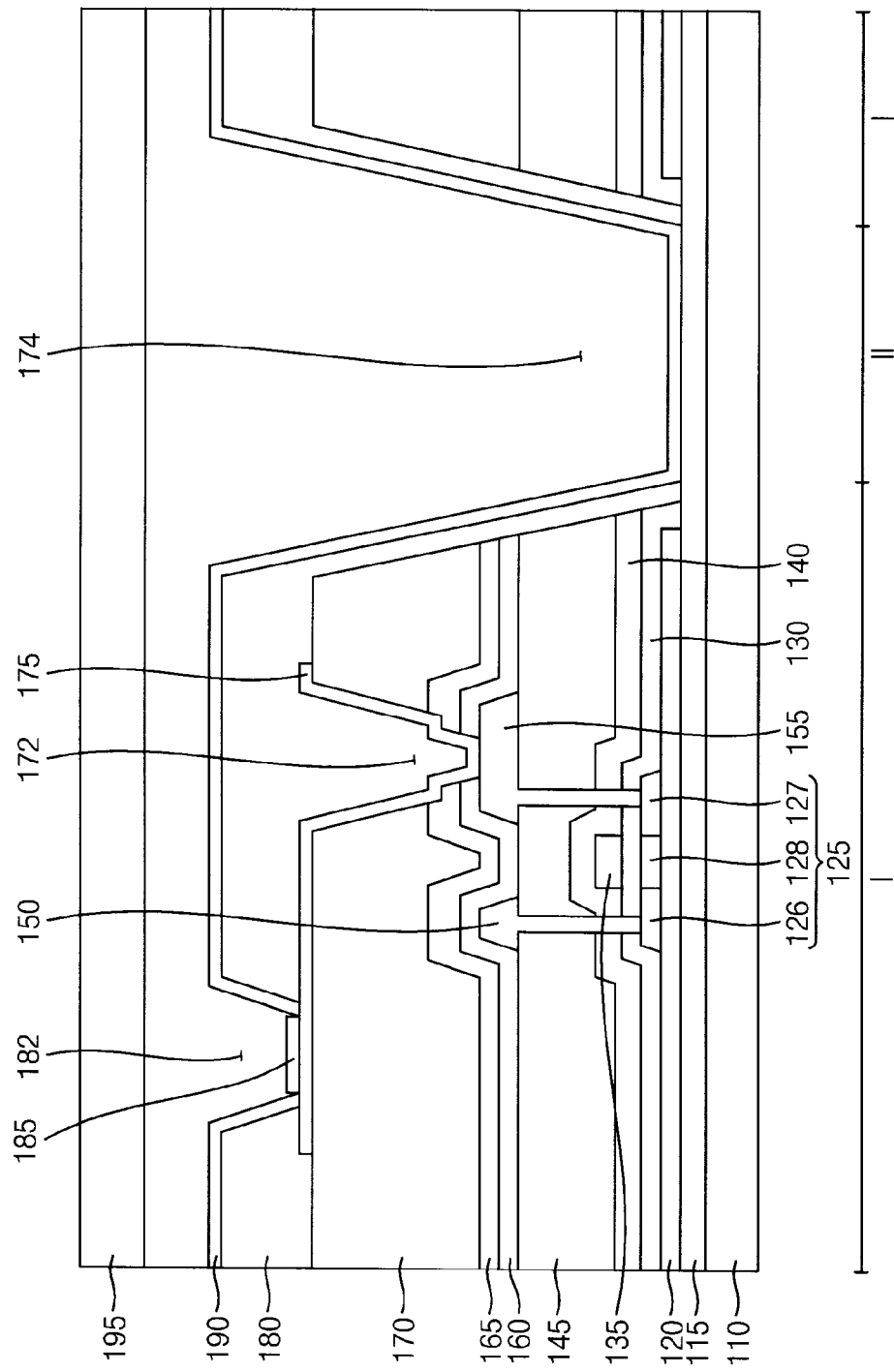

Referring now to FIG. 7, an organic light emitting structure 185 may be formed on the portion of the first electrode 170 exposed by the pixel opening 182 of the pixel defining layer 180. The organic light emitting structure 185 may extend along the sidewalls of the pixel opening 182 of the pixel defining layer 180. The second electrode 190 may include a material substantially the same as that of the first electrode 175. Alternatively, the second electrode 190 may include a material different from that of the first electrode 175.

Figure 8:
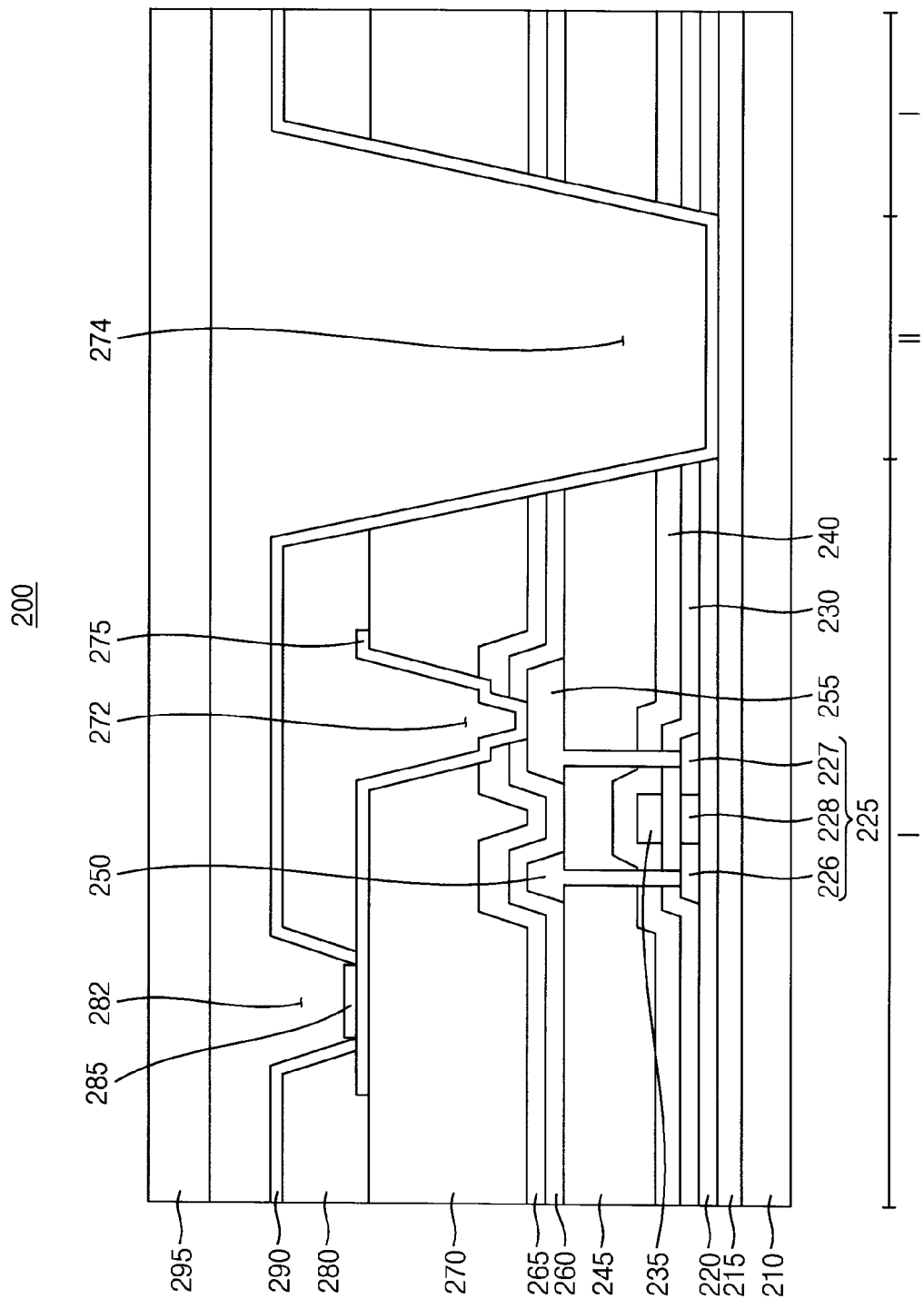
FIG. 8 is a cross sectional view illustrating an organic light emitting display device in accordance with some exemplary embodiments.

FIG. 8 is a cross sectional view illustrating an organic light emitting display device in accordance with some exemplary embodiments of the present disclosure. Since the organic light emitting display device 200 of FIG. 8 has substantially the structure as the organic light emitting display device 100 of FIG. 1, except for a black matrix 220, duplicated descriptions will be omitted.

Referring to FIG. 8, an organic light emitting display device 200 may include a substrate 210, a black matrix 220, thin film transistors, an insulation layer 270, first electrodes 265, pixel defining layer 280, organic light emitting structures 275, a second electrode 280, etc.

The black matrix 220 may be disposed on the buffer layer 215. The black matrix 220 may define a pixel region I and a transparent region II, and may also operate as a light blocking layer. Although, the black matrix 220 may be disposed in a region substantially similar to the region in which the light blocking member 120 illustrated in FIG. 1 is disposed in FIG. 8, the invention is not limited thereto. For example, the black matrix 220 may extend further into the transparent region II, to at least partially define a shape of the transparent region II, as compared with the light blocking member only.

The black matrix 220 may include a black material. Examples of the black material for the black matrix 220 may include carbon black, phenylene black, aniline black, cyanine black, nigrosine acid black and/or a black resin. Thus, surface areas the transparent regions II exposed by the black matrix 220 may be different from each other. As a result, the black matrix 220 may at least partially define an asymmetrical configuration of adjacent transparent regions II, so that the adjacent transparent regions II may have different widths and/or different lengths, respectively. Since the adjacent transparent regions II may have different widths W1 and/or lengths D1, a periodicity of shapes of the transparent regions II may be substantially reduced or eliminated. As a result, a diffraction interference of light of the organic light emitting display device 200 may be substantially reduced.

The organic light emitting display device 200 may include the black matrix 220 at least partially defining the asymmetrical configuration of the adjacent transparent regions II. Thus, as compared with a conventional organic light emitting display device having the plurality of transparent regions repeatedly arranged with a constant gap, the diffraction interference of the light passing through the organic light emitting display device 200 may be suppressed, by substantially reducing or substantially eliminating the periodicity of the shapes of the transparent regions II. As a result, the image of the object before and/or after the transparent region II of the organic light emitting display device 200 may be clearly recognized by a user, while the organic light emitting display device 200 is in an OFF state. In addition, the organic light emitting display device 200 may have improved image quality in the pixel regions I of the organic light emitting display device 200, while the organic light emitting display device 200 is in an ON state.

The insulation layer 270 may be disposed on a third insulating interlayer 265. In exemplary embodiments, a first gate insulation layer 230, a second gate insulation layer 240, a first insulating interlayer 245, a second insulating interlayer 260, a third insulating interlayer 265, and the insulation layer 270 may be partially etched to form an opening 274 partially exposing the transparent region II of the substrate 210.

As illustrated above, the organic light emitting display device 200 illustrated in FIG. 8 may include the opening 275 partially exposing the transparent region II of the substrate 210. In addition, the organic light emitting display device 200 may include the black matrix 220 including the black material to define an asymmetrical configuration of adjacent transparent regions II. For example, the adjacent transparent regions II may be arranged in the asymmetrical configuration. The black matrix 220 may be disposed on the substrate 210 in the pixel region I. However, the black matrix 220 may not be disposed in the opening 274. Thus, the diffraction interference of the light passing through the organic light emitting display device 200 may be suppressed by substantially reducing or substantially eliminating the periodicity of the shapes of the transparent regions II. Therefore, the image distortion may be prevented while the organic light emitting display device is in the OFF state. Thus, the quality of the images displayed in the pixel region I may be improved while the organic light emitting display device is in the ON state.

Figure 9:
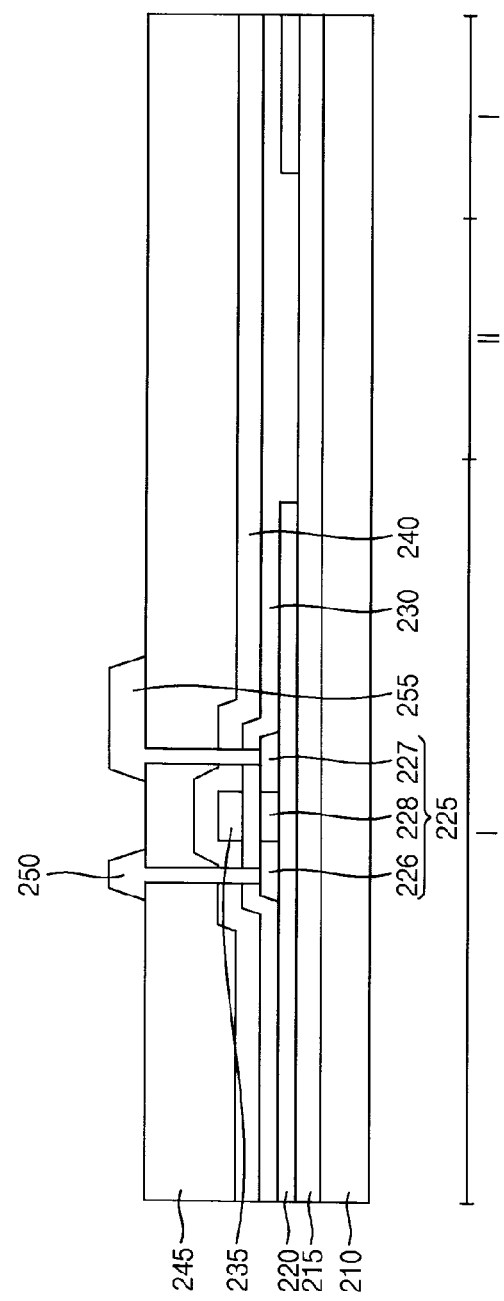
FIGS. 9 to 13 are cross sectional views illustrating a method of manufacturing an organic light emitting display device in accordance with some exemplary embodiments.

FIGS. 9 to 13 are cross sectional views illustrating a method of manufacturing an organic light emitting display device in accordance with some exemplary embodiments of the present disclosure. Referring to FIG. 9, a buffer layer 215 may be formed on the substrate 210.

A black matrix 220 may be formed on the buffer layer 215, in the pixel region I of the substrate 210. The black matrix 220 may be formed using a black material such as carbon black, phenylene black, aniline black, cyanine black, nigrosine acid black and/or a black resin. For example, the black matrix 220 may be formed by a printing process, an inkjet process, a spin coating process, etc. Thus, the surface areas of the transparent region II exposed by the black matrix 220 may be different from each other. Therefore, the adjacent transparent regions II, which are separated from each other by a predetermined distance on opposing sides of the pixel regions may be arranged in an asymmetrical configuration to block incident external light. The process for manufacturing the black matrix 220 may be substantially the same as the process for manufacturing the light blocking member 120 illustrated in FIG. 2.

An active pattern 225 may be formed on the black matrix 220. The active pattern 225 may be formed using silicon, an oxide semiconductor, etc.

Referring now to FIG. 9, a first gate insulation layer 230 may be formed on the buffer layer 215. The first gate insulation layer 230 may cover the active pattern 225. The first gate insulation layer 230 may be formed using silicon compound such as silicon oxide, silicon carbon oxide, etc.

A gate electrode 235 may be formed on the first gate insulation layer 230. The gate electrode 235 may be overlapped with the active pattern 225 while interposing the first gate insulation layer 230 therebetween. The gate electrode 235 may be formed using a metal, an alloy, a conductive metal oxide, a transparent conductive material, etc. Additionally, a source region 226, a drain region 227, and a channel region 228 may be formed in the active pattern 125 by doping the impurities into the active pattern 225 using the gate electrode 235 as masks.

A second gate insulation layer 240 may be formed on the first gate insulation layer 230. The second gate insulation layer 240 may cover the gate electrode 235. The second gate insulation layer 240 may be formed using a material substantially the same as that of the first gate insulation layer 230.

A first insulating interlayer 245 may be formed on the second gate insulation layer 240. The first insulating interlayer 245 may be formed using a silicon compound, a transparent resin, etc.

The first insulating interlayer 245 may be partially etched to form contact holes exposing the source region 232 and the drain region 234. A source electrode 250 and a drain electrode 255 may be formed on the first insulating interlayer by filling the contact holes. The source electrode 250 may contact the source region 232, and the drain electrode 255 may contact the drain region 234.

Figure 10:
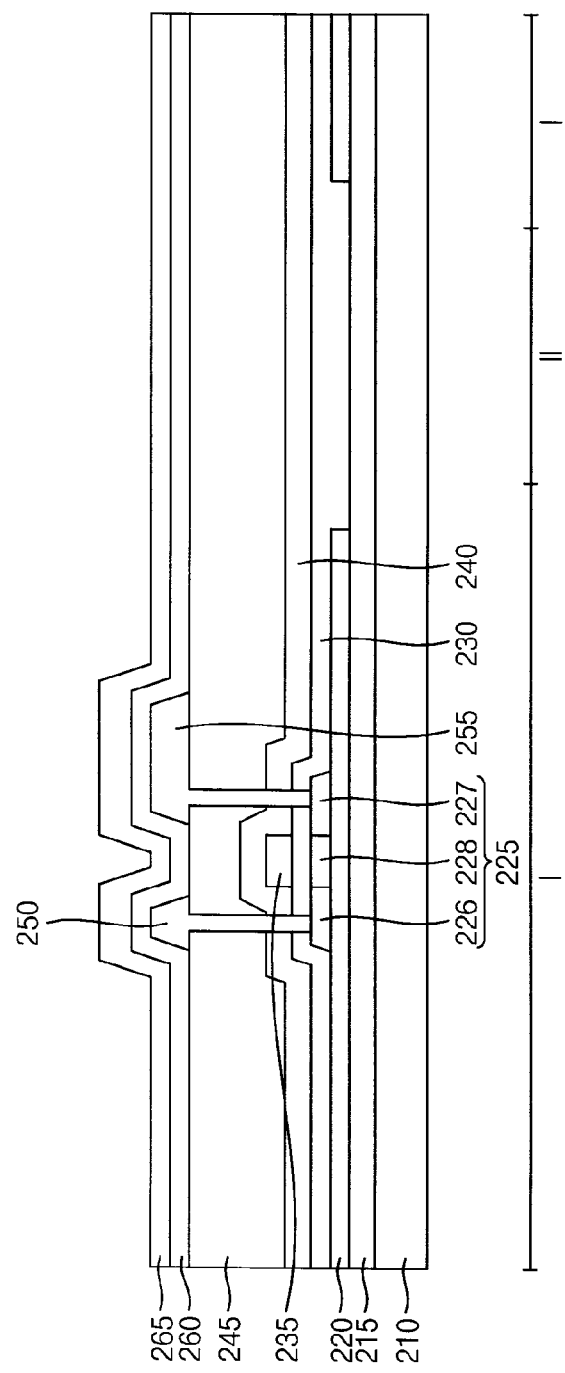

Referring to FIG. 10, a second insulating interlayer 260 may be formed on the first insulating interlayer 245 to cover the source and the drain electrodes 250 and 255. A third insulating interlayer 265 may be formed on the second insulating interlayer 260. Each of the second insulating interlayer 260 and the third insulating interlayer 265 may include a material substantially the same as the first insulating interlayer 245.

Figure 11:
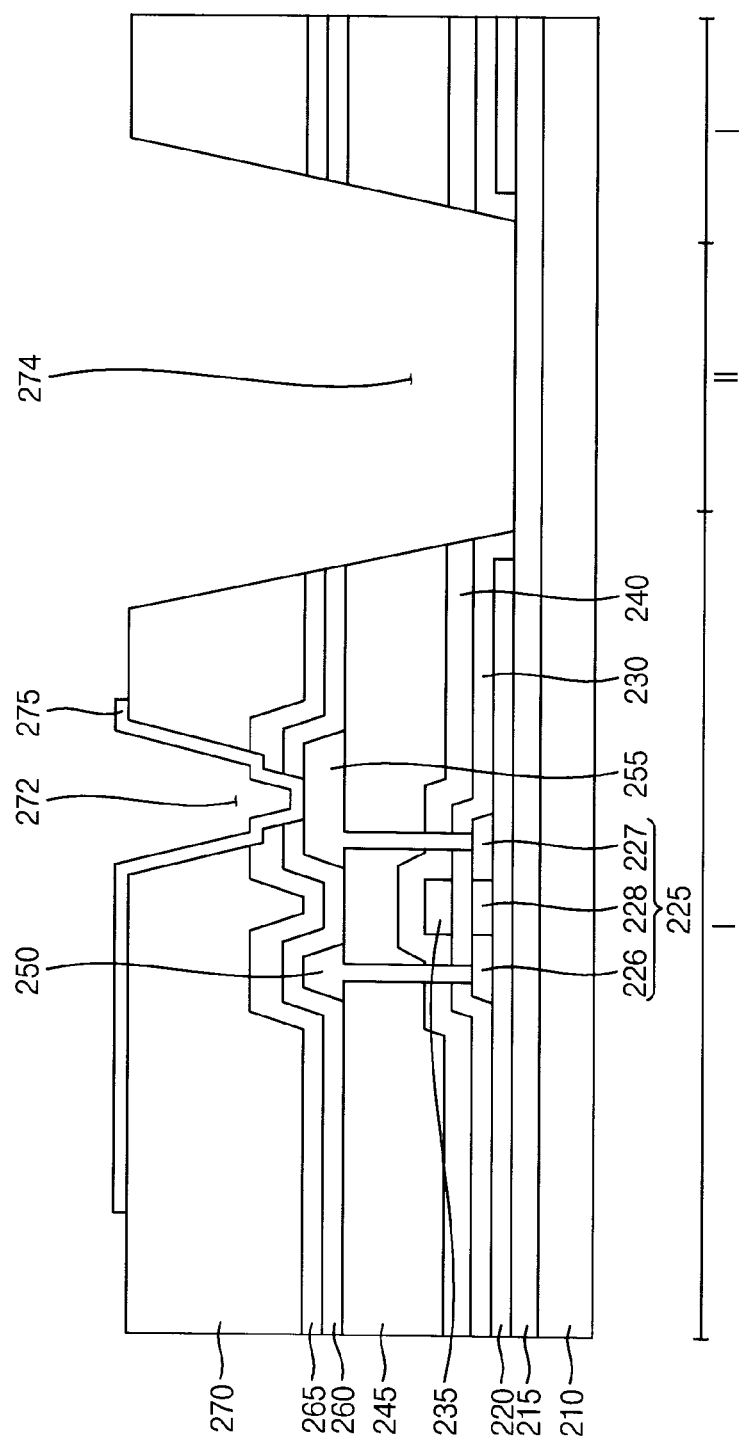

Referring to FIG. 11, an insulation layer 270 may be formed on the third insulating interlayer 265 to cover the thin film transistor. The insulation layer 270, the second insulating interlayer 260, and the third insulating interlayer 265 may be partially etched to form a contact hole 272 partially exposing the transparent region II of the substrate 210. The contact hole 272 and the opening 274 may be formed using a same dry etching process or wet etching process, using one mask. For example, the contact hole 272 and the opening 274 may be simultaneously formed using a same etching gas or etching solution.

Referring now to FIG. 11, a first electrode 275 may be formed on the insulation layer 270 by filling the contact hole 272. The first electrode 275 may be formed using a reflective material or a transparent material, such as a metal, an alloy, a metal nitride, a conductive metal oxide, a transparent conductive material, etc.

A pixel defining layer 280 having a pixel opening 282 may be formed on the first electrode 275 and the insulation layer 270. The pixel defining layer 280 may be disposed on sidewalls of the opening 274. For example, the pixel defining layer 280 may be formed using an organic material or an inorganic material.

Figure 12:
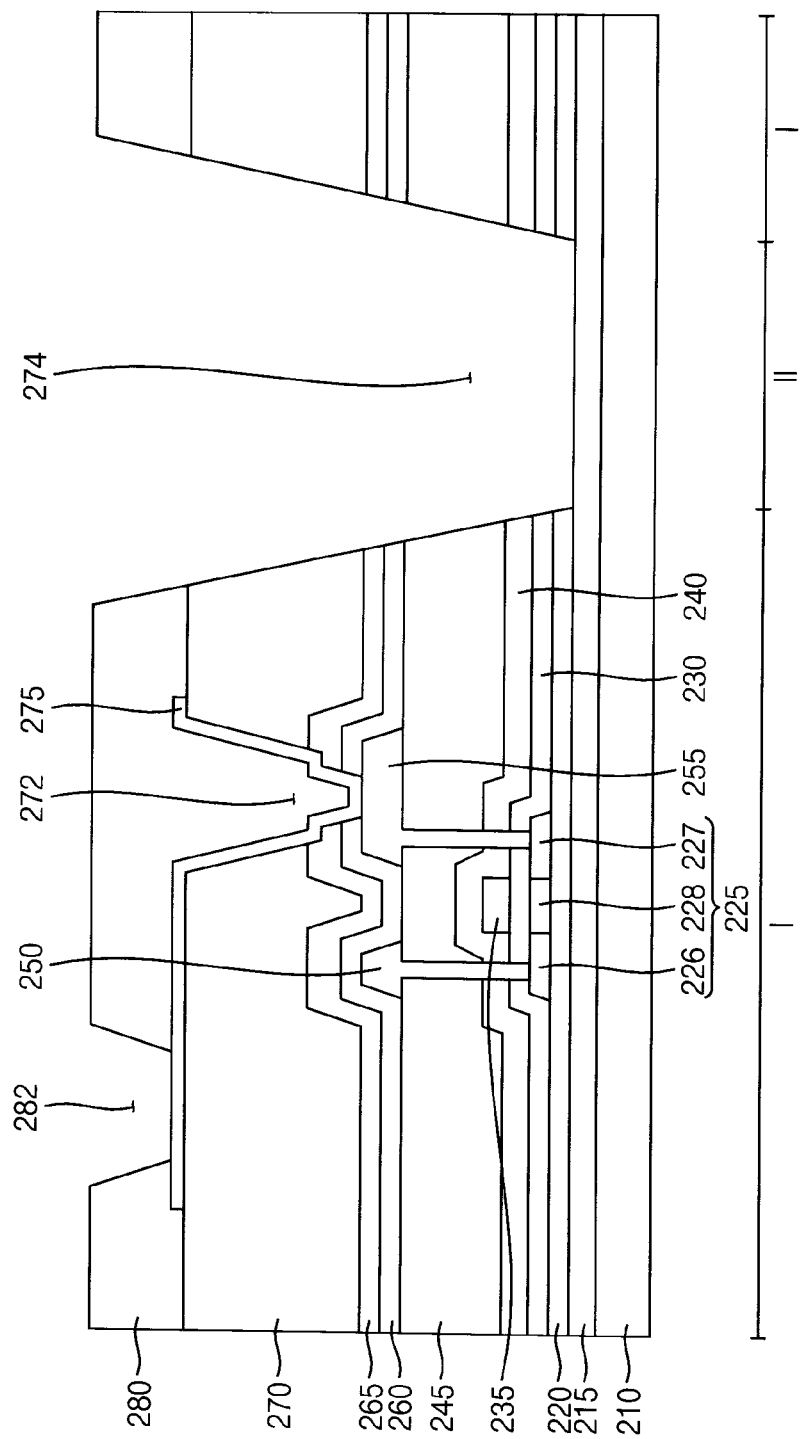
Figure 13:
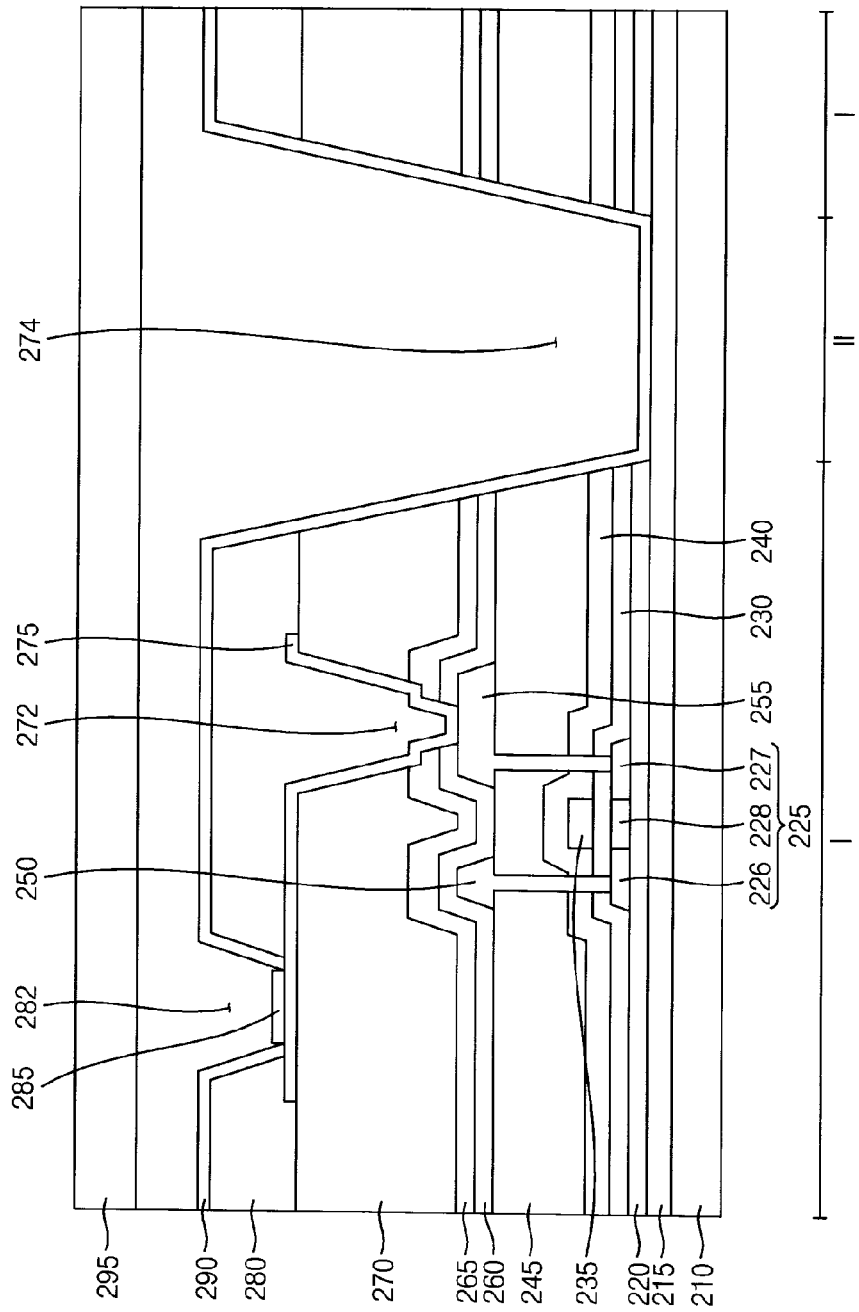

Referring to FIG. 12, an organic light emitting structure 285 may be formed on the portion of the first electrode 275 exposed by the pixel opening 282 of the pixel defining layer 280. Additionally, the organic light emitting structure 285 may be disposed on sidewalls of the pixel opening 282 of the pixel defining layer 280.

Exemplary embodiments of the invention may be employed in any electronic device including a transparent organic light emitting display device. For example, the transparent organic light emitting display device according to embodiments may be used in a refrigerator for business, a smart window, a transparent tablet, a head-up display device, a wearable display device, etc.

The foregoing is illustrative of exemplary embodiments of the present disclosure and is not to be construed as limiting thereof. Although a few exemplary embodiments have been described, those skilled in the art will readily appreciate that many modifications are possible in the exemplary embodiments, without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device comprising:
   a substrate comprising pixel regions and transparent regions;
   thin film transistors disposed in the pixel regions;
   an insulation layer disposed on the thin film transistors;
   first electrodes electrically connected to the thin film transistors;
   a pixel defining layer comprising a black material, disposed on the first electrodes, the pixel defining layer at least partially defining the transparent regions, such that adjacent transparent regions disposed on opposing sides of corresponding pixel regions have an asymmetrical configuration with respect to the corresponding pixel regions;
   organic light emitting structures disposed on the pixel defining layer; and
   a second electrode disposed on the organic light emitting structures,
   wherein the adjacent transparent regions have different widths and different lengths from each other.

2. The organic light emitting display device of claim 1, wherein each of the thin film transistors comprises:
   an active pattern disposed on the substrate;
   a gate insulation layer covering the active pattern;
   a gate electrode disposed on the gate insulation layer;
   an insulating interlayer covering the gate electrode; and
   a source electrode and a drain electrode that extend through the gate insulation layer and the insulating interlayer to contact the active pattern.

3. The organic light emitting display device of claim 2, further comprising openings extending through the gate insulation layer, the insulating interlayer, and the insulation layer, the openings partially exposing the transparent regions.

4. The organic light emitting display device of claim 3, wherein the pixel defining layer extends onto sidewalls of the openings, such that adjacent transparent regions are at least partially defined by the pixel defining layer.

5. The organic light emitting display device of claim 4, wherein the surfaces areas of the adjacent transparent regions are determined by the portions of the pixel defining layer disposed on the sidewalls of the openings.

6. The organic light emitting display device of claim 1, wherein the black material comprises at least one selected from the group consisting of carbon black, phenylene black, aniline black, cyanine black, nigrosine acid black, and a black resin.

7. The organic light emitting display device of claim 1, further comprising a light blocking member disposed in the pixel regions.

8. An organic light emitting display device comprising:
a substrate comprising pixel regions and transparent regions;
thin film transistors disposed in the pixel regions;
an insulation layer disposed on the thin film transistors;
first electrodes electrically connected to the thin film transistors;
a pixel defining layer comprising a black material, disposed on the first electrodes, the pixel defining layer at least partially defining the transparent regions, such that adjacent transparent regions disposed on opposing sides of corresponding pixel regions have an asymmetrical configuration with respect to the corresponding pixel regions;
organic light emitting structures disposed on the pixel defining layer; and
a second electrode disposed on the organic light emitting structures,
wherein:
the insulation layer comprises a black material; and
the insulation layer at least partially defines the asymmetrical configuration of the adjacent transparent regions.

* * * * *